US012628567B2

(12) United States Patent
Wu et al.

(10) Patent No.: US 12,628,567 B2
(45) Date of Patent: May 12, 2026

(54) METHOD FOR FABRICATING SEMICONDUCTOR DEVICE

(71) Applicant: UNITED MICROELECTRONICS CORP., Hsin-Chu City (TW)

(72) Inventors: Hung-Yi Wu, Keelung City (TW);
Jia-Rong Wu, Kaohsiung City (TW);
Yu-Hsiang Lin, New Taipei City (TW);
Yi-Wen Chen, Tainan City (TW);
Kun-Sheng Yang, Pingtung County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 655 days.

(21) Appl. No.: 17/703,967

(22) Filed: Mar. 24, 2022

(65) Prior Publication Data

US 2023/0270017 A1     Aug. 24, 2023

(30) Foreign Application Priority Data

Feb. 24, 2022    (CN) ......................... 202210171542.X

(51) Int. Cl.
*H10N 50/01*      (2023.01)
*H10P 50/00*      (2026.01)

(52) U.S. Cl.
CPC ........... *H10N 50/01* (2023.02); *H10P 50/691* (2026.01)

(58) Field of Classification Search
CPC ... H01L 21/76289; H10N 50/01; H01F 41/34;

H01F 10/3254; H03K 3/011; H03K 17/687; H10D 30/65; H10D 64/112; H10D 62/109; H10D 62/393; H10P 50/691

See application file for complete search history.

(56) References Cited

U.S. PATENT DOCUMENTS

| | | | |
|---|---|---|---|
| 2007/0004196 A1 | 1/2007 | Nam | |
| 2013/0062714 A1* | 3/2013 | Zhu | G11C 11/161 257/E29.323 |
| 2016/0268499 A1* | 9/2016 | You | H10N 50/01 |
| 2020/0006155 A1* | 1/2020 | Chiang | H01L 21/823864 |
| 2020/0161541 A1 | 5/2020 | Tseng | |
| 2020/0161542 A1* | 5/2020 | Ahn | H01F 41/307 |
| 2020/0373478 A1* | 11/2020 | Wang | H10N 50/01 |
| 2021/0013401 A1* | 1/2021 | Lee | H10B 61/22 |

FOREIGN PATENT DOCUMENTS

EP          3 591 703 A1     1/2020

* cited by examiner

*Primary Examiner* — Jacob Y Choi
*Assistant Examiner* — Neil R Prasad
(74) *Attorney, Agent, or Firm* — Winston Hsu

(57)          ABSTRACT

A method for fabricating a semiconductor device includes the steps of forming a magnetic tunneling junction (MTJ) on a substrate, forming a spin orbit torque (SOT) layer on the MTJ, forming an inter-metal dielectric (IMD) layer around the MTJ and the SOT layer, forming a first hard mask on the IMD layer, forming a semiconductor layer on the first hard mask, and then patterning the first hard mask.

9 Claims, 6 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of forming a magnetic tunneling junction (MTJ) on a substrate, forming a spin orbit torque (SOT) layer on the MTJ, forming an inter-metal dielectric (IMD) layer around the MTJ and the SOT layer, forming a first hard mask on the IMD layer, forming a semiconductor layer on the first hard mask, and then patterning the first hard mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
FIGS. 1-11 illustrate a method for fabricating a MRAM device according to an embodiment of the present invention.
Figure 1:
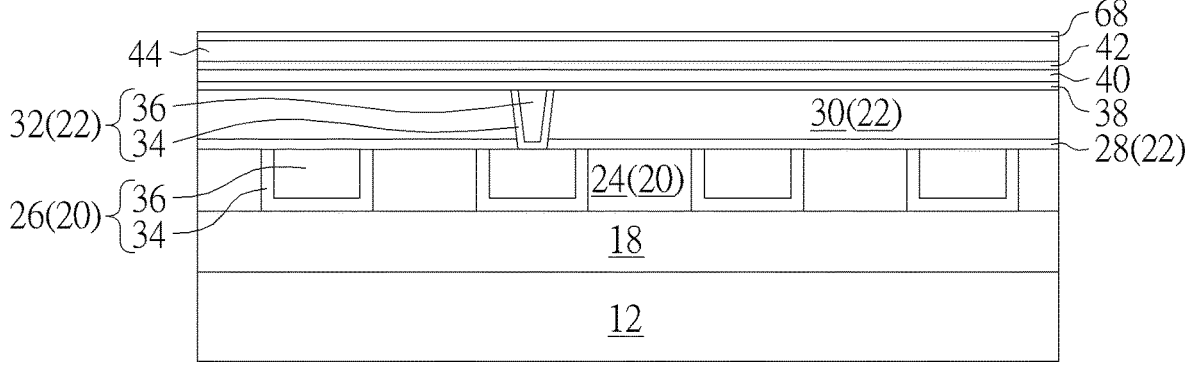

Referring to FIGS. 1-11, FIGS. 1-11 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 is made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 38, a MTJ stack 40 or stack structure, a top electrode 42, a spin orbit torque (SOT) layer 44, and a hard mask 68 are formed on the metal interconnect structure 22. In this embodiment, the formation of the MTJ stack 40 could be accomplished by sequentially depositing a pinned layer, a barrier layer, and a free layer on the bottom electrode 38. In this embodiment, the bottom electrode 38 and the top electrode 42 are preferably made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. Preferably, the first SOT layer 44 is serving as a channel for the MRAM device as the first SOT layer 44 could include metals such as tantalum (Ta), tungsten (W), platinum (Pt), or hafnium (Hf) and/or topological insulator such as bismuth selenide ($Bi_xSe_{1-x}$). The hard mask 68 preferably includes conductive material or metal such as ruthenium (Ru), but not limited thereto.

Figure 2:
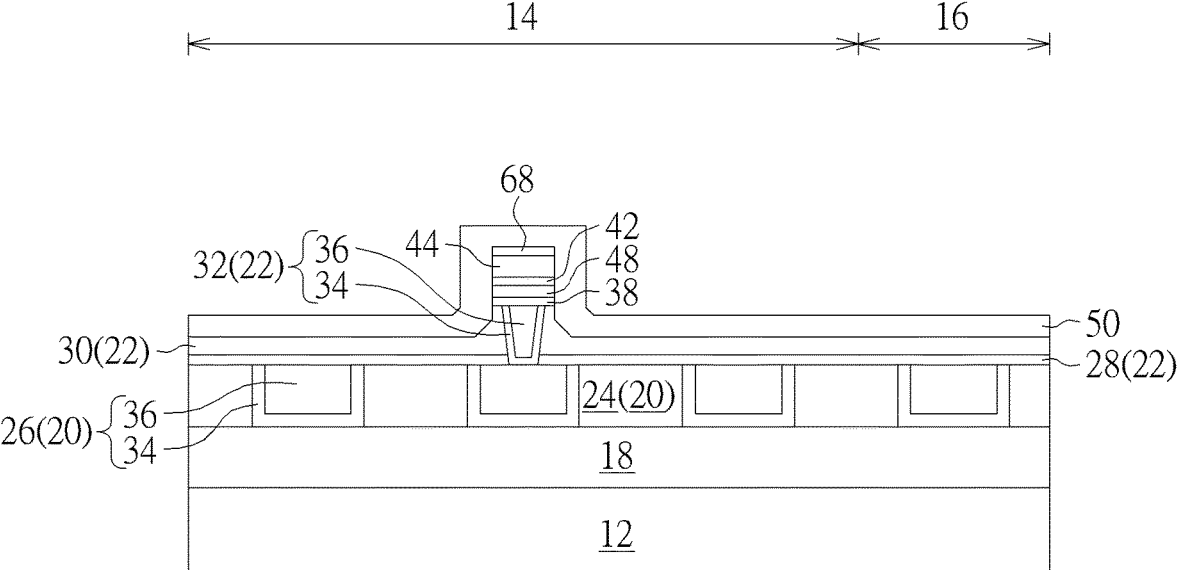

Next, as shown in FIG. 2, one or more etching process could be conducted to by using a patterned mask (not shown) as mask to remove part of the hard mask 68, part of the SOT layer 44, part of the top electrode 42, part of the MTJ stack 40, part of the bottom electrode 38, and part of the IMD layer 30 to form a MTJ 48 on the MRAM region 14, and the patterned mask is removed thereafter. It should be noted that a reactive ion etching (RIE) process or an ion beam etching (IBE) process could be conducted at this stage to remove the top electrode 42, MTJ stack 40, bottom electrode 38, and the IMD layer 30 in this embodiment for forming the MTJ 48. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 could be removed at the same time to form inclined sidewalls on the surface of the metal interconnection 32 immediately adjacent to the MTJ 48.

Next, a cap layer 50 is formed on the MTJ 48 while covering the surface of the IMD layer 30 on the MRAM region 14 and the logic region 16. In this embodiment, the cap layer 50 preferably includes silicon nitride, but could also include other dielectric material including but not limited to for example silicon oxide, silicon oxynitride (SiON), or silicon carbon nitride (SiCN).

Figure 3:
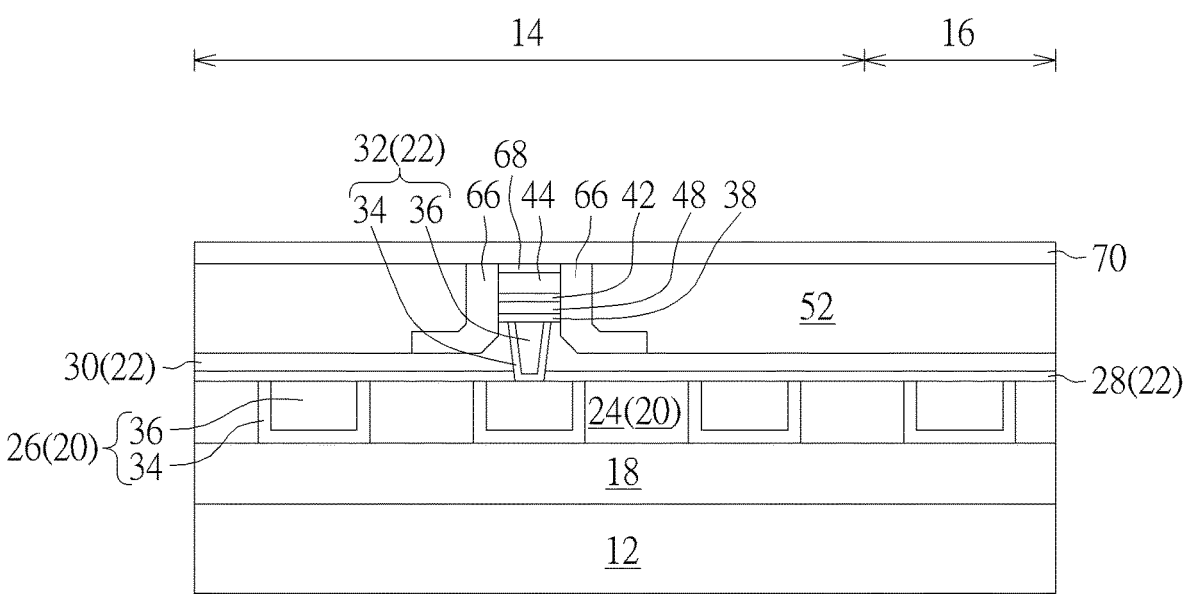

Next, as shown in FIG. 3, an etching process is conducted without using any patterned mask such as patterned resist to remove part of the cap layer 50 for forming a spacer 66 around or adjacent to sidewalls of the MTJ 48, the SOT layer 44, and the hard mask 68, in which the spacer 66 preferably includes a L-shape in a cross-section view. Next, a deposition process such as an atomic layer deposition (ALD) process is conducted to form an IMD layer 52 on the hard mask 68, the spacer 66, and the IMD layer 30, and then a planarizing process such as a chemical mechanical polishing (CMP) or etching back process is conducted to remove part of the IMD layer 52 so that the top surface of the remaining IMD layer 52 is even with the top surface of the hard mask 68. Next, another hard mask 70 is formed on the IMD layer 52 to cover the hard mask 68 and the spacer 66, in which the hard mask 70 is preferably made of metal nitride such as TiN, but not limited thereto.

Figure 4:
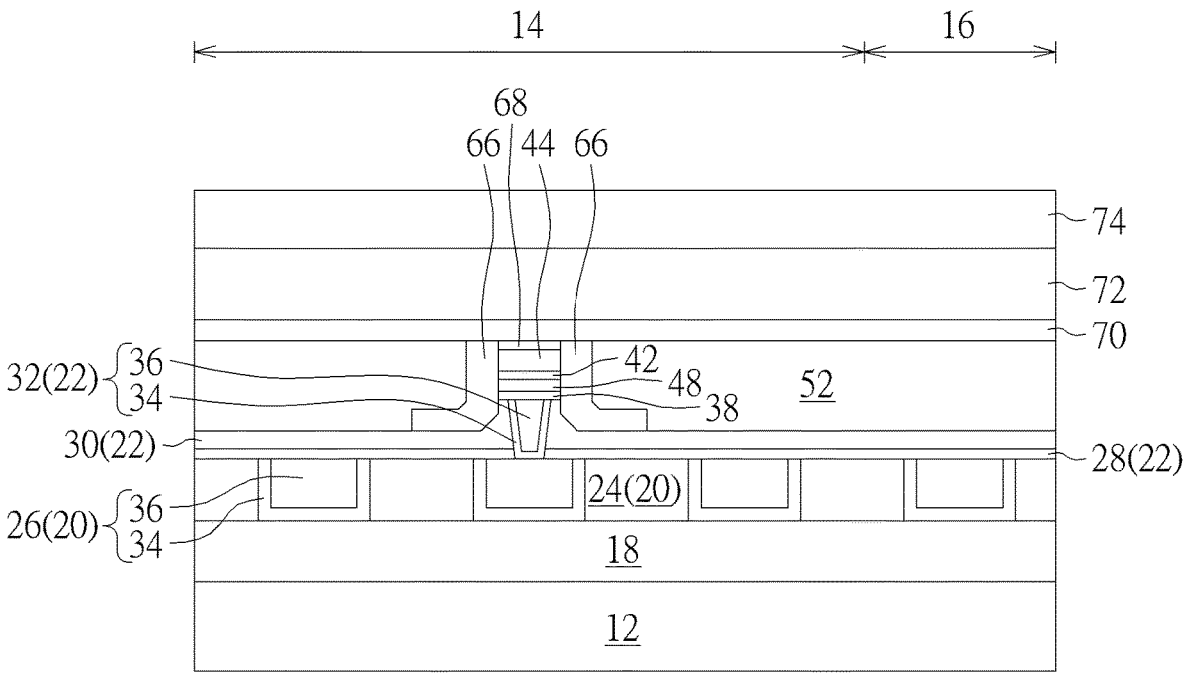

Next, as shown in FIG. 4, a semiconductor layer 72 and another hard mask 74 is formed on the hard mask 70. Preferably, the semiconductor layer 72 includes silicon such as polysilicon or amorphous silicon and the hard mask 74 includes a dielectric layer such as silicon nitride, but not limited thereto.

Figure 5:
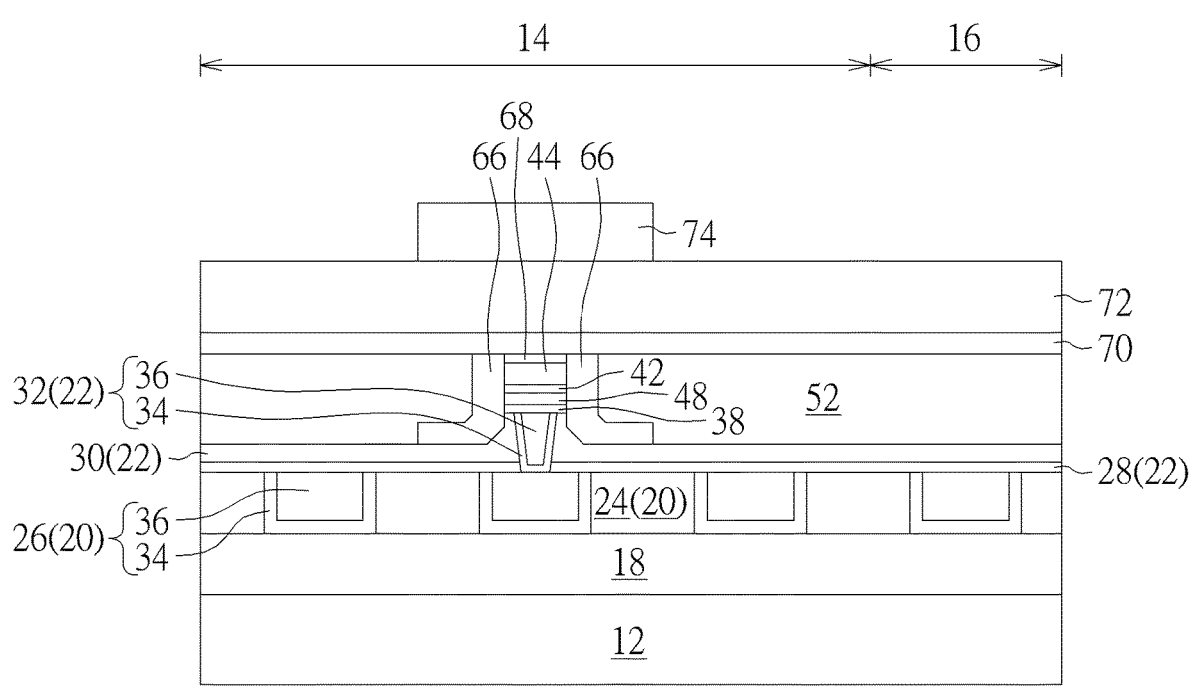

Next, as shown in FIG. 5, a patterned mask (not shown) such as a patterned resist is formed on the hard mask 74, an etching process is conducted by using the patterned mask as mask to remove part of the hard mask 74 for exposing the top surface of the semiconductor layer 72, and the patterned mask is removed thereafter.

Figure 6:
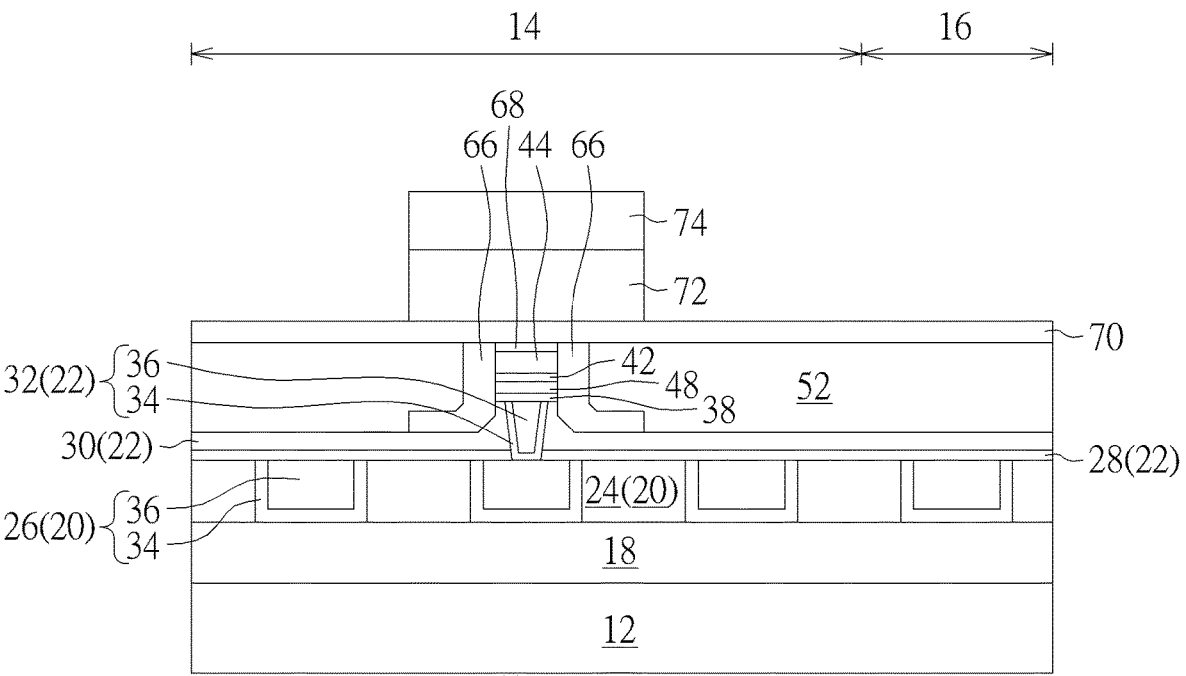

Next, as shown in FIG. 6, a dry etching process is conducted by using the patterned hard mask 74 as mask to pattern the semiconductor layer 72 and stop on the surface of the hard mask 70.

Figure 7:
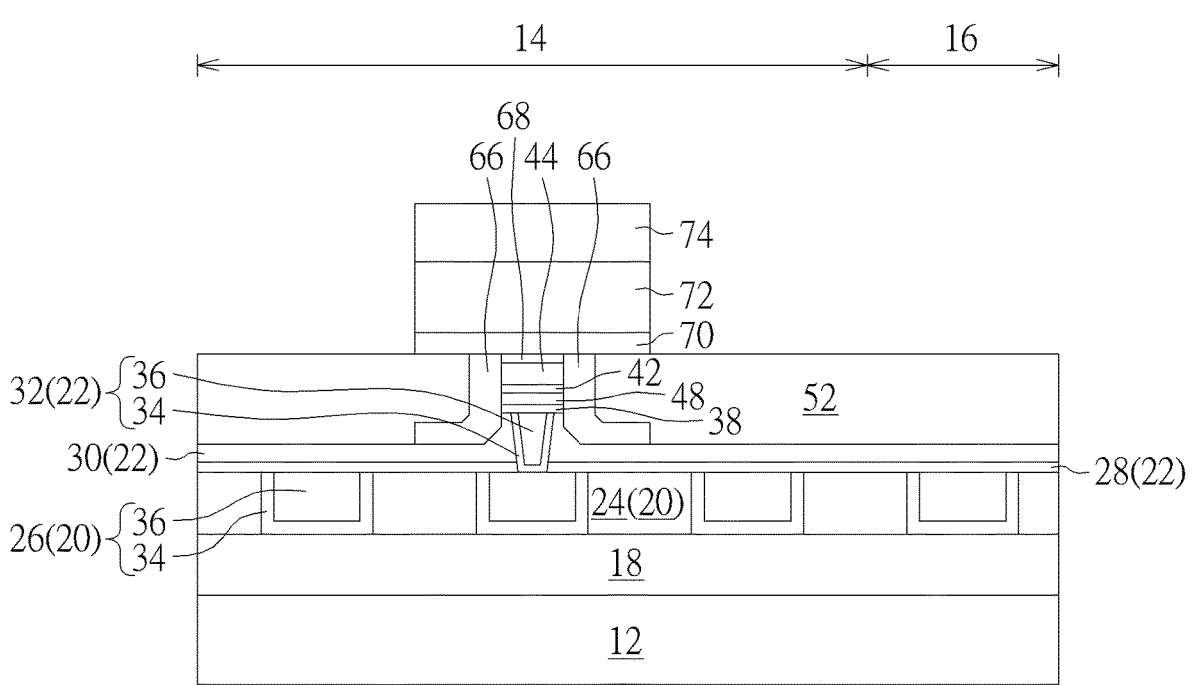

Next, as shown in FIG. 7, a wet etching process is conducted by using the hard mask 74 again to remove part of the hard mask 70 for exposing the top surface of the IMD layer 52 as the sidewall of the hard mask 74 is aligned with sidewalls of the semiconductor layer 72 and hard mask 70. Preferably, the wet etching process conducted at this stage could be accomplished by etchant such as standard clean SC2 for removing the hard mask 70, but not limited thereto.

Figure 8:
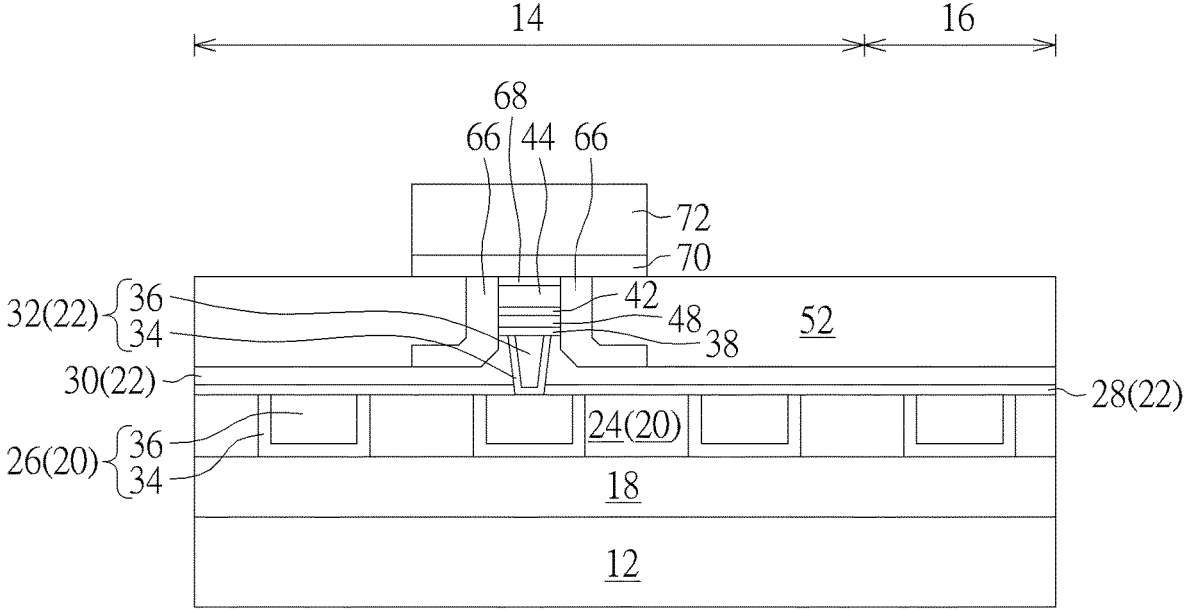

Next, as shown in FIG. 8, a wet etching process is conducted to remove hard mask 74 completely and exposing the top surface of the semiconductor layer 72. Preferably, the wet etching process conducted at this stage could be accomplished by using phosphoric acid ($H_3PO_4$) to completely remove the hard mask 74 made of SiN and exposing the surface of the semiconductor layer 72.

Figure 9:
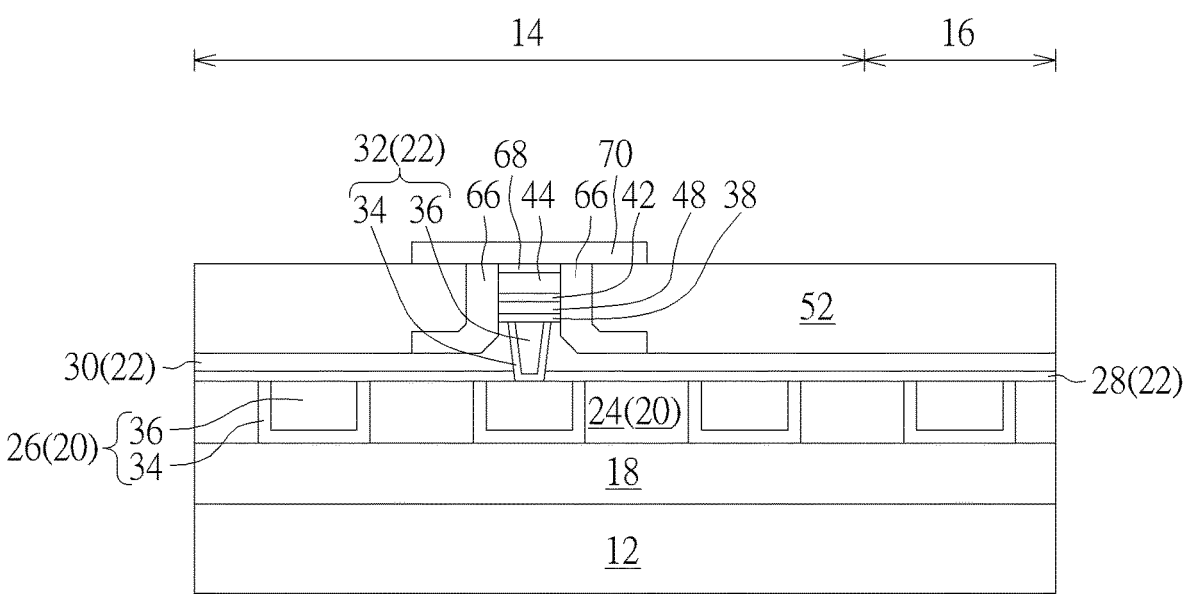

Next, as shown in FIG. 9, another wet etching process is conducted to remove the semiconductor layer 72, in which the wet etching process could be accomplished by using tetramethyl ammonium hydroxide (TMAH) to completely remove the semiconductor layer 72 made of polysilicon and expose the top surface of the hard mask 70.

Figure 10:
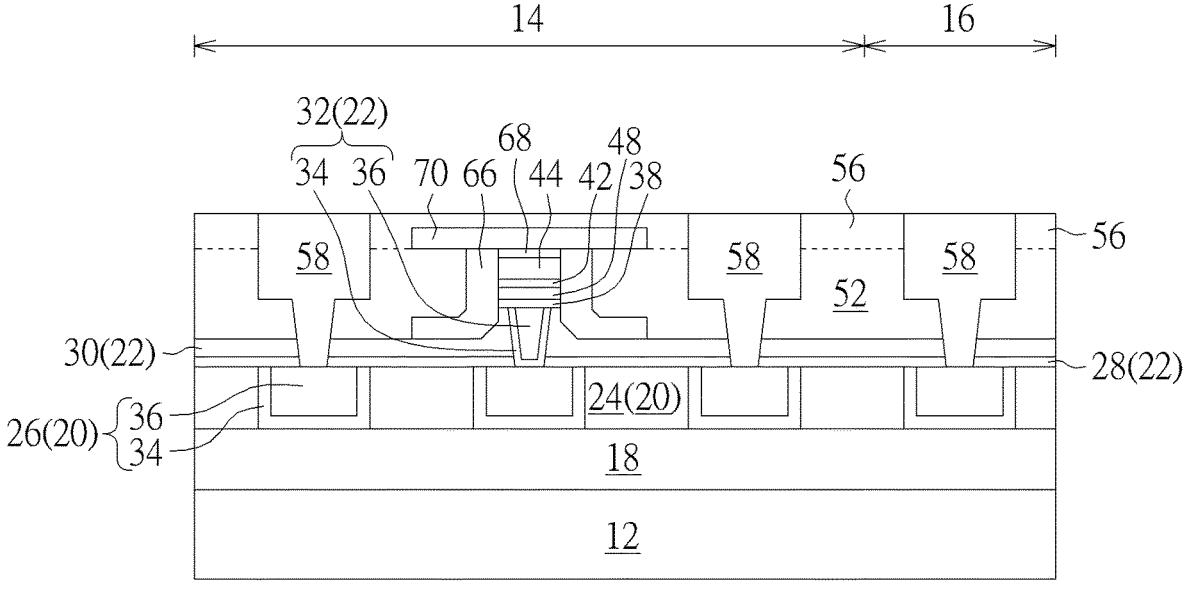

Next, as shown in FIG. 10, another IMD layer 56 is formed on the hard mask 70 and the IMD layer 52. In this embodiment, each of the IMD layer 52 and IMD layer 56 preferably includes an ultra low-k (ULK) dielectric layer including but not limited to for example porous material or silicon oxycarbide (SiOC) or carbon doped silicon oxide (SiOCH). Next, a planarizing process such as chemical mechanical polishing (CMP) process or etching back process is conducted to remove part of the IMD layer 56 while the top surface of the remaining IMD layer 56 is still higher than the top surface of the hard mask 70.

Next, a pattern transfer process is conducted by using a patterned mask (not shown) to remove part of the IMD layer 56, part of the IMD layer 52, part of the IMD layer 30, and part of the stop layer 28 on the MRAM region 14 and logic region 16 to form contact holes (not shown) exposing the metal interconnections 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the afore-mentioned barrier layer and metal layer to form metal interconnections 58 in the contact holes electrically connecting the metal interconnections 26.

Figure 11:
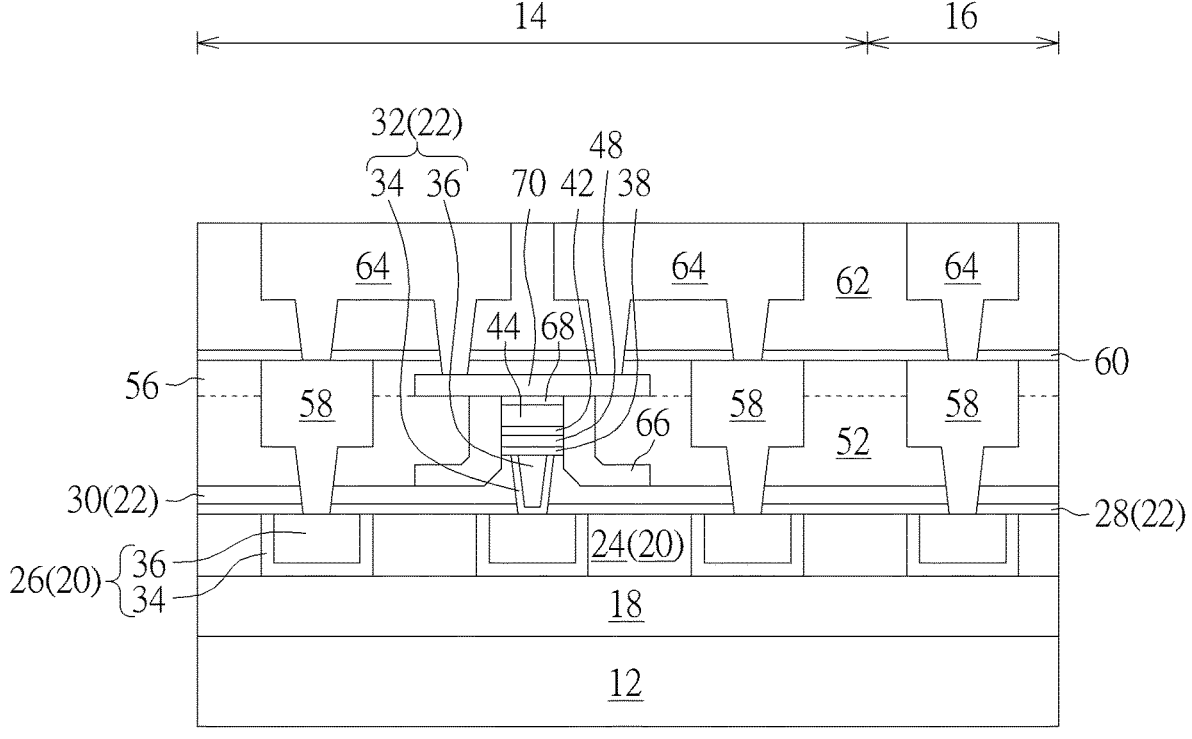

Next, as shown in FIG. 11, a stop layer 60 is formed on the MRAM region 14 and logic region 16 to cover the IMD layer 56 and metal interconnections 58, an IMD layer 62 is formed on the stop layer 60, and one or more photo-etching process is conducted to remove part of the IMD layer 62, part of the stop layer 60, and part of the IMD layer 56 on the MRAM region 14 and logic region 16 to form contact holes (not shown). Next, conductive materials are deposited into each of the contact holes and a planarizing process such as CMP is conducted to form metal interconnections 64 connecting the MTJ 48 and metal interconnections 58 underneath, in which the metal interconnections 64 on the MRAM region 14 directly contacts the hard mask 70 underneath while the metal interconnections 64 on the logic region 16 directly contacts the metal interconnections 58 on the lower level.

In this embodiment, the stop layers 60 and 28 could be made of same or different materials, in which the two layers 60, 28 could all include nitrogen doped carbide (NDC), silicon nitride, silicon carbon nitride (SiCN), or combination thereof. Similar to the metal interconnections formed previously, each of the metal interconnections 64 could be formed in the IMD layer 62 through a single damascene or dual damascene process. For instance, each of the metal interconnections 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Typically, a composite mask made of silicon nitride and silicon oxide is formed on the hard mask 70 before patterning the hard mask 70 made of TiN in current practice, and then a dry etching process is conducted to pattern the hard mask 70 and diluted hydrofluoric acid (dHF) is used to remove the composite hard mask made of silicon nitride and silicon oxide. Nevertheless, the dHF used during the patterning process easily consumes IMD layer and damages the surface of the device. To resolve this issue, the present invention first forms a hard mask 72 made of semiconductor material such as polysilicon and a hard mask 74 made of silicon nitride before patterning the hard mask 70, and then conducts a series of etching processes by using these two hard masks for carrying out the patterning process. By using this hard mask made of two different materials for patterning the hard mask 70 made of TiN, it would be desirable to omit the utilization of dHF and use etchant recipe such as SC2 and/or phosphoric acid to carry out the etching process for patterning the hard mask 70 instead. By doing so, damages caused by dHF on the surface of IMD layer during patterning of the hard mask 70 could be minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming a magnetic tunneling junction (MTJ) stack on a substrate;
    forming a spin orbit torque (SOT) layer on the MTJ stack;
    forming a third hard mask directly on the SOT layer;
    patterning the third hard mask, the SOT layer, and the MTJ stack to form a MTJ, wherein sidewalls of the third hard mask, the SOT layer, and the MTJ are aligned;
    forming a spacer adjacent to two sides of the third hard mask, the SOT layer, and the MTJ;
    forming an inter-metal dielectric (IMD) layer around the MTJ and the SOT layer, wherein top surfaces of the IMD layer and the third hard mask are coplanar;
    forming a first hard mask on the IMD layer and the MTJ, wherein a bottom surface of the first hard mask is even with top surfaces of the IMD layer, the spacer, and the third hard mask;
    forming a semiconductor layer on and directly contacting a top surface of the first hard mask, wherein the semiconductor layer overlaps the MTJ and the first IMD entirely and a bottom surface of the semiconductor layer is higher than top surfaces of IMD layer, the spacer, and the third hard mask; and
    patterning the first hard mask.

2. The method of claim 1, further comprising:
    forming the spacer adjacent to the MTJ and the SOT layer;
    forming the IMD layer around the spacer;
    forming a second hard mask on the semiconductor layer;
    patterning the semiconductor layer;
    using the second hard mask to pattern the first hard mask;
    removing the second hard mask; and
    removing the semiconductor layer.

3. The method of claim 2, further comprising conducting a dry etching process to pattern the semiconductor layer.

4. The method of claim 2, further comprising conducting a wet etching process to remove the first hard mask.

5. The method of claim 2, further comprising conducting a wet etching process to remove the second hard mask.

6. The method of claim 2, further comprising conducting a wet etching process to remove the semiconductor layer.

7. The method of claim 2, wherein the second hard mask comprises a dielectric layer.

8. The method of claim 1, wherein the first hard mask comprises metal nitride.

9. The method of claim 1, wherein the semiconductor layer comprises polysilicon.

* * * * *